United States Patent
Mahadeswaraswamy

(10) Patent No.: US 10,256,123 B2
(45) Date of Patent: Apr. 9, 2019

(54) COMPONENT TEMPERATURE CONTROL USING A COMBINATION OF PROPORTIONAL CONTROL VALVES AND PULSED VALVES

(71) Applicant: Applied Materials, Inc., Santa Clara, CA (US)

(72) Inventor: Chetan Mahadeswaraswamy, San Franscisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1032 days.

(21) Appl. No.: 13/652,257

(22) Filed: Oct. 15, 2012

(65) Prior Publication Data

US 2013/0105084 A1    May 2, 2013

Related U.S. Application Data

(60) Provisional application No. 61/552,352, filed on Oct. 27, 2011.

(51) Int. Cl.
  *C23F 1/08* (2006.01)
  *F28F 27/02* (2006.01)
  *H01L 21/67* (2006.01)

(52) U.S. Cl.
  CPC .............................. *H01L 21/67109* (2013.01)

(58) Field of Classification Search
  USPC ................. 118/728–733; 156/345.51–345.55
  See application file for complete search history.

(56) References Cited

U.S. PATENT DOCUMENTS

| | | | |
|---|---|---|---|
| 5,835,334 A | 11/1998 | McMillin et al. | |
| 5,974,816 A | 11/1999 | Endo | |
| 8,303,715 B2 | 11/2012 | Hamelin et al. | |
| 2003/0127188 A1* | 7/2003 | Matsumoto | H01J 37/32082 156/345.1 |

(Continued)

FOREIGN PATENT DOCUMENTS

| | | |
|---|---|---|
| TW | 2010-13813 A | 4/2010 |
| TW | 2010-29091 A | 8/2010 |

OTHER PUBLICATIONS

Motor Operated Valve. Source: http://www.enggcyclopedia.com/2012/05/motor-operated-valve/ Accessed: Jun. 7, 2016.*

(Continued)

*Primary Examiner* — Parviz Hassanzadeh
*Assistant Examiner* — Tiffany Z Nuckols
(74) *Attorney, Agent, or Firm* — Schwabe, Williamson & Wyatt, P.C.

(57) ABSTRACT

Methods and systems for controlling temperatures in plasma processing chamber with a combination of proportional and pulsed fluid control valves. A heat transfer fluid loop is thermally coupled to a chamber component, such as a chuck. The heat transfer fluid loop includes a supply line and a return line to each of hot and cold fluid reservoirs. In an embodiment, an analog valve (e.g., in the supply line) is controlled between any of a closed state, a partially open state, and a fully open state based on a temperature control loop while a digital valve (e.g., in the return line) is controlled to either a closed state and a fully open state.

13 Claims, 5 Drawing Sheets

(56) References Cited

U.S. PATENT DOCUMENTS

| | | | |
|---|---|---|---|
| 2006/0219360 A1* | 10/2006 | Iwasaki | G05D 23/1902 |
| | | | 156/345.27 |
| 2007/0178020 A1* | 8/2007 | Atlas | G05D 23/1919 |
| | | | 422/105 |
| 2008/0017107 A1 | 1/2008 | Arai et al. | |
| 2009/0118872 A1* | 5/2009 | Nonaka et al. | 700/285 |
| 2009/0321017 A1* | 12/2009 | Tsubone et al. | 156/345.27 |
| 2010/0099266 A1 | 4/2010 | Oswald et al. | |
| 2010/0116788 A1* | 5/2010 | Singh et al. | 216/66 |
| 2010/0126666 A1* | 5/2010 | Tandou | H01J 37/32522 |
| | | | 156/345.27 |
| 2010/0224355 A1 | 9/2010 | Iwasaki | |
| 2011/0132541 A1 | 6/2011 | Tandou et al. | |
| 2011/0186545 A1 | 8/2011 | Mahadeswaraswamy et al. | |

OTHER PUBLICATIONS

Solenoid Valve. Source: http://www.enggcyclopedia.com/2011/08/solenoid-valves/ Accessed: Jun. 7, 2016.*

International Preliminary Report dated May 8, 2014 for PCT/US2012/061105 filed Oct. 19, 2012.

* cited by examiner

COMPONENT TEMPERATURE CONTROL USING A COMBINATION OF PROPORTIONAL CONTROL VALVES AND PULSED VALVES

CROSS-REFERENCE TO RELATED APPLICATIONS

This application claims the benefit of U.S. Provisional Application No. 61/552,352 filed on Oct. 27, 2011 titled "ESC TEMPERATURE CONTROL USING A COMBINATION OF PROPORTIONAL CONTROL VALVES AND PULSED VALVES," the content of which is hereby incorporated by reference in its entirety for all purposes.

This application is related to U.S. Utility application Ser. No. 13/111,334 filed on May 19, 2011, titled "TEMPERATURE CONTROL IN PLASMA PROCESSING APPARATUS USING PULSED HEAT TRANSFER FLUID FLOW," and U.S. Utility application Ser. No. 13/040,149 filed on Mar. 3, 2011, titled "COMPONENT TEMPERATURE CONTROL BY COOLANT FLOW CONTROL AND HEATER DUTY CYCLE CONTROL.

TECHNICAL FIELD

Embodiments of the present invention generally relate to plasma processing equipment, and more particularly to methods of controlling chamber component temperatures during processing of a workpiece with a plasma processing chamber.

BACKGROUND

In a plasma processing chamber, such as a plasma etch or plasma deposition chamber, the temperature of a chamber component is often an important parameter to control during a process. For example, a temperature of a substrate holder, commonly called a chuck or pedestal, may be controlled to heat/cool a workpiece to various controlled temperatures during the process recipe (e.g., to control an etch rate). Similarly, a temperature of a showerhead/upper electrode or other component may also be controlled during the process recipe to influence the processing. Conventionally, a heat sink and/or heat source is coupled to the processing chamber to maintain the temperature of a chamber component at a desired temperature. Often, at least one heat transfer fluid loop thermally coupled to the chamber component is utilized to provide heating and/or cooling power.

While most systems typically run the heat transfer fluid loop at a fixed flow rate with the heat transfer fluid reservoir at a fixed temperature, the above referenced related applications teach the advantages of modulating the heat transfer liquid flow rate based on a temperature control algorithm to achieve better temperature control (improved responsivity, less overshoot, etc.). These related applications also describe digital valves with pulse wave modulation (PWM) to change a duty cycle of a heat transfer liquid for control of a temperature. While economical, digital valve architectures may however be subject to frequent actuation and correspondingly limited lifetimes. Also, depending on liquid mass flow rates in the heating and cooling loops, abrupt valve closures may impart large momentum changes (i.e., fluid hammer) causing pressure waves increasing the risk of mechanical failures in the system.

SUMMARY OF DESCRIPTION

Methods and systems for controlling temperatures in plasma processing chamber with a combination of proportional and pulsed fluid control valves is described. Proportional control valves having a partially open state may be utilized to provide analog heat transfer fluid flow rate control while digital control valves lacking a partially open state are utilized to cycle or "pulse" a heat transfer fluid loop between an external heat sink and a heat source.

In an embodiment, a supply line and a return line thermally couple a heat transfer fluid reservoir to a temperature controlled component, such as a chuck. An electronic supply valve in the supply line and an electronic return valve in the return line control conduction of the heat transfer fluid between the heat transfer fluid reservoir and the temperature controlled component. One of the supply and return valves has a closed state, a partially open state, and a fully open state (e.g., analog) while the other valve has a closed state and only a fully open state, lacking a partially open state (e.g., digital).

In embodiments, multiple supply lines and multiple heat transfer fluid reservoirs (e.g., hot and cold) are coupled to the temperature controlled component via multiple supply and return lines with the electronic return valves functioning to prevent mixing of the heat transfer fluids. In each supply line there is an electronic supply valve having a closed state, a partially open state, and a fully open state. In each return line there is an electronic return valve having a closed state and only a fully open state.

In embodiments where the temperature controlled component has multiple temperature zones, multiple heat transfer fluid reservoirs (e.g., hot and cold) are coupled to each of the temperature zone via multiple supply and return lines. In each supply line there is an electronic supply valve having a closed state, a partially open state, and a fully open state. In each return line there is an electronic return valve having a closed state and only a fully open state.

In embodiments, conduction of a heat transfer fluid between the heat transfer fluid reservoir and the temperature controlled component is by controlling the electronic supply valve between the closed state, the partially open state(s), and fully open state, while the electronic return valve is modulated to either the closed state and the fully open state to permit fluid flow as limited by the supply valve position. In certain embodiments, the state of the return valve is only changed if the supply valve is changed either from any of the open states to the closed state or from the closed state to any of the open states.

BRIEF DESCRIPTION OF THE DRAWINGS

Embodiments of the invention, both as to organization and method of operation, together with objects, features, and advantages thereof, may best be understood by reference to the following detailed description when read with the accompanying drawings, in which.

DETAILED DESCRIPTION

In the following detailed description, numerous specific details are set forth in order to provide a thorough understanding of embodiments of the invention. However, it will be understood by those skilled in the art that other embodiments may be practiced without these specific details. In other instances, well-known methods, procedures, components and circuits have not been described in detail so as not to obscure the present invention. Some portions of the detailed description that follows are presented in terms of algorithms and symbolic representations of operations on data bits or binary digital signals within a computer memory.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

Figure 1:
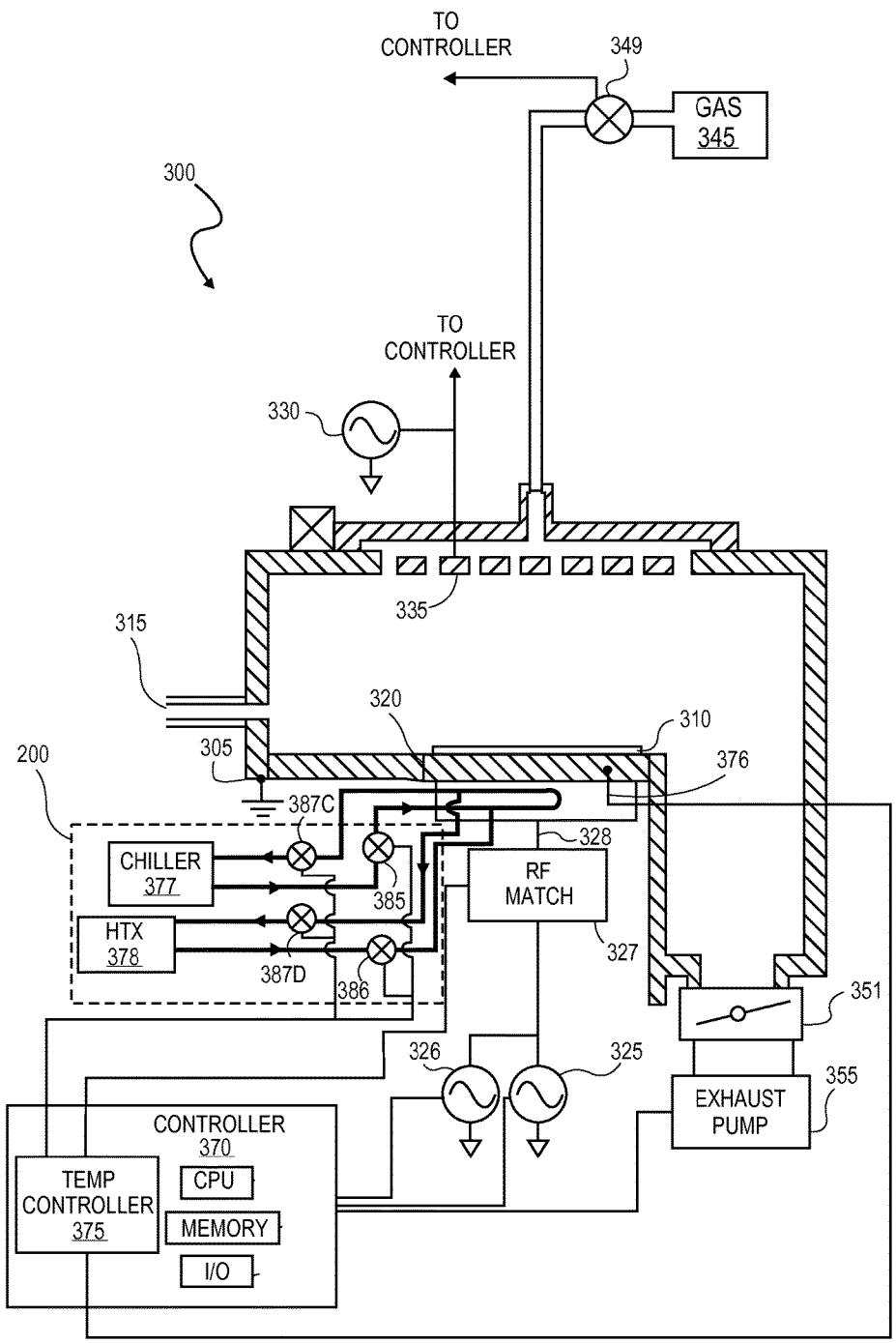
FIG. 1 illustrates a schematic of a plasma etch system including a heat transfer fluid-based heat source and a heat transfer fluid-based heat sink coupled to a workpiece supporting chuck, in accordance with an embodiment of the present invention.

FIG. 1 illustrates a cross-sectional schematic view of a plasma etch system 300 which includes a component for which temperature is controlled. The plasma etch system 300 may be any type of high performance etch chamber known in the art, such as, but not limited to, Enabler™, MxP®, MxP+™, Super-E™, DPS II AdvantEdge™ G3, or E-MAX® chambers manufactured by Applied Materials of CA, USA. Other commercially available etch chambers may be similarly controlled. While the exemplary embodiments are described in the context of the plasma etch system 300, it should be further noted that the temperature control system architecture described herein is also adaptable to other plasma processing systems (e.g., plasma deposition systems, etc.).

The plasma etch system 300 includes a grounded chamber 305. A substrate 310 is loaded through an opening 315 and clamped to a temperature controlled chuck 320. The substrate 310 may be any workpiece conventionally employed in the plasma processing art and the present invention is not limited in this respect. In particular embodiments, temperature controlled chuck 320 includes a plurality of zones, each zone independently controllable to a temperature setpoint which may be the same or different between the zones. In the exemplary embodiment, an inner thermal zone is proximate a center of substrate 310 and an outer thermal zone is proximate to a periphery/edge of substrate 310. Process gases, are supplied from gas source 345 through a mass flow controller 349 to the interior of the chamber 305. Chamber 305 is evacuated via an exhaust valve 351 connected to a high capacity vacuum pump stack 355.

When plasma power is applied to the chamber 305, a plasma is formed in a processing region over substrate 310. A first plasma bias power 325 is coupled to the chuck 320 (e.g., cathode) via transmission line 328 to energize the plasma. The plasma bias power 325 typically has a low frequency between about 2 MHz to 60 MHz, and in a particular embodiment, is in the 13.56 MHz band. In the exemplary embodiment, the plasma etch system 300 includes a second plasma bias power 326 operating at about the 2 MHz band which is connected to the same RF match 327 as plasma bias power 325 to provide a dual frequency bias power. In one dual frequency bias power embodiment a 13.56 MHz generator supplies between 500 W and 3000 W while a 2 MHz generator supplies between 0 and 7000 W of power for a total bias power ($W_{b,tot}$) of between 500 W and 10000 W. In another dual frequency bias power embodiment a 60 MHz generator supplies between 100 W and 3000 W while a 2 MHz generator supplies between 0 and 7000 W of power for a total bias power ($W_{b,tot}$) of between 100 W and 10000 W.

A plasma source power 330 is coupled through a match (not depicted) to a plasma generating element 335 (e.g., showerhead) which may be anodic relative to the chuck 320 to provide high frequency source power to energize the plasma. The plasma source power 330 typically has a higher frequency than the plasma bias power 325, such as between 100 and 180 MHz, and in a particular embodiment, is in the 162 MHz band. In particular embodiments the top source operates between 100 W and 2000 W. Bias power more directly affects the bias voltage on substrate 310, controlling ion bombardment of the substrate 310, while source power more directly affects the plasma density.

Notably, the system component to be temperature controlled by the control method 100 is neither limited to the chuck 320 nor must the temperature controlled component directly couple a plasma power into the process chamber. In an alternative embodiment for example, a showerhead through which a process gas is input into the plasma process chamber is the temperature controlled component. For such showerhead embodiments, the showerhead may or may not be RF powered. In still other embodiments, the temperature controlled component is a wall of the chamber 305.

For a high bias power density (kW/workpiece area) embodiment, such as that applicable to dielectric etching where 5 kW powers applied to a 300 mm is not uncommon, it is problematic to supply heating power to the chuck 320 via a resistive heater because of RF filtering issues. For the plasma etch system 300, the chuck heating power (e.g., to elevate the chuck temperature to 50° C.) and chuck cooling power (e.g., to reduce the chuck temperature to −5° C.) is provided by a heat transfer fluid loop. For such embodiments, the heat transfer fluid loop is alternately coupled to a heat sink or source to cool or heat the chuck 320. In the exemplary embodiment, the temperature controller 375 is coupled, either directly, or indirectly (via the controller 370) to a chiller 377 (heat sink) and a heat exchanger 378 (heat source). The temperature controller 375 may acquire the temperature setpoint of the chiller 377 and/or the heat exchanger (HTX) 378. In an exemplary feedforward control algorithm, a difference between the temperature of the chiller 377 and a temperature setpoint for the chuck 320 as well as a difference between the temperature of the heat exchanger 378 and the chuck 320 are inputs along with plasma power (e.g., total bias power).

In a first temperature state, the heat transfer fluid loop conducts a cold liquid (e.g., Galden or Fluorinert, etc. at a temperature setpoint of −5° C. while in another temperature state, liquid at high temperature (e.g., Galden or Fluorinert, etc. at a temperature setpoint of 55° C.) is conducted by the heat transfer fluid loop. As such, referring back to FIG. 1, when chuck cooling is required, a first supply valve 385 is opened. Similarly when chuck heating is required, a second supply valve 386 for the heating loop is opened. In preferred embodiments, only one of the heating and cooling supply valves 385 and 386 is in an open state at any particular time such that a total fluid flow to the chuck 320 at any given time is delivered from either the chiller 377 or the HTX 378. Return valves 387C and 387D are controlled in coordination with the supply valves 385 and 386 so that mixing of heat transfer fluid between the two loops is controlled. For example when the first supply valve 385 is in an open state, the first return valve 387C is open while the second return valve 387D is closed and vice versa when the second supply valve 386 is in an open state. In this manner, temperature states of the heat transfer fluid loop alternate in a "pulsed" manner.

In an embodiment, flow rate in a heat transfer fluid loop is controlled via a valve capable of partially open states while a valve capable of only a closed state and a fully open state is utilized to maintain separate temperature states (i.e., minimize mixing of heat transfer fluid at different temperatures). A proportional valve (analog) capable of partially open states between 0% (closed) and 100% (fully open) is utilized as the control point (e.g., based on thermocouple 376) for the heat transfer fluid flow rate within the loop while a second valve in the loop is a digital valve capable of controlling flows to either 0% or 100% (fully open) is utilized to complete a "pulse" or "switch" between heat sink and heat source. Referring to FIG. 1, when the heat transfer fluid loop is coupled to the chiller 377, either the supply valve 385 or the return valve 387C may be the proportional valve while the other is digital. In a preferred embodiment, the supply valve 385 is proportional while the return valve 387C is digital. In this configuration the return valve 387C is merely serving to limit the heat transfer fluid from the chiller 377 mixing with fluid in the HTX 378 and can be any small, inexpensive digital valve sized to accommodate the maximum flow rate of the supply valve 385. The supply valve 385 may be any commercially available analog valve capable of proportional flow control. As such, either the temperature controller 375 or another module between the temperature controller and the supply valve may provide any digital to analog conversion (DAC) necessary for valve positional control, as known in the art. DAC may be provided as part of the supply valve 385. Because only one of the supply and return valves is proportional, the additional expense, control line complexity of analog control, and footprint associated with analog implementations is limited to the one valve (e.g., supply valve 385).

Where the heat transfer fluid loop is operable between heating and cooling temperature states, one a pair of valves is operable at partially open states (corresponding on non-zero flows less than maximum flow) while another pair of valves has only closed and fully open states. In the embodiment illustrated in FIG. 1, the supply valve 386 or the second return valve 387D in the heat transfer fluid loop coupling HTX 378 to the chuck 320 is operable for proportional control while the other is not. In the preferred embodiment, the supply valve 386 is operable for proportional control while the return valve 387D is digital such that the pair of supply valves 385, 386 are operable to provide analog flow control while the pair of return valves 387C, 387D are both operable to provide only digital flow control. In an alternative embodiment, the return valves 387C and 387D are combined into a single three way valve (not depicted) having the fixed flow rate corresponding to fully open which alternates between the chiller 377 and HTX 378. In such an embodiment, the supply valves 385 and 386 are operable at partially open states with the return valve 387 being operable at a plurality of fully open states/fully closed states, relative to the chuck 320, chiller 377, and the HTX 378.

Figure 2:
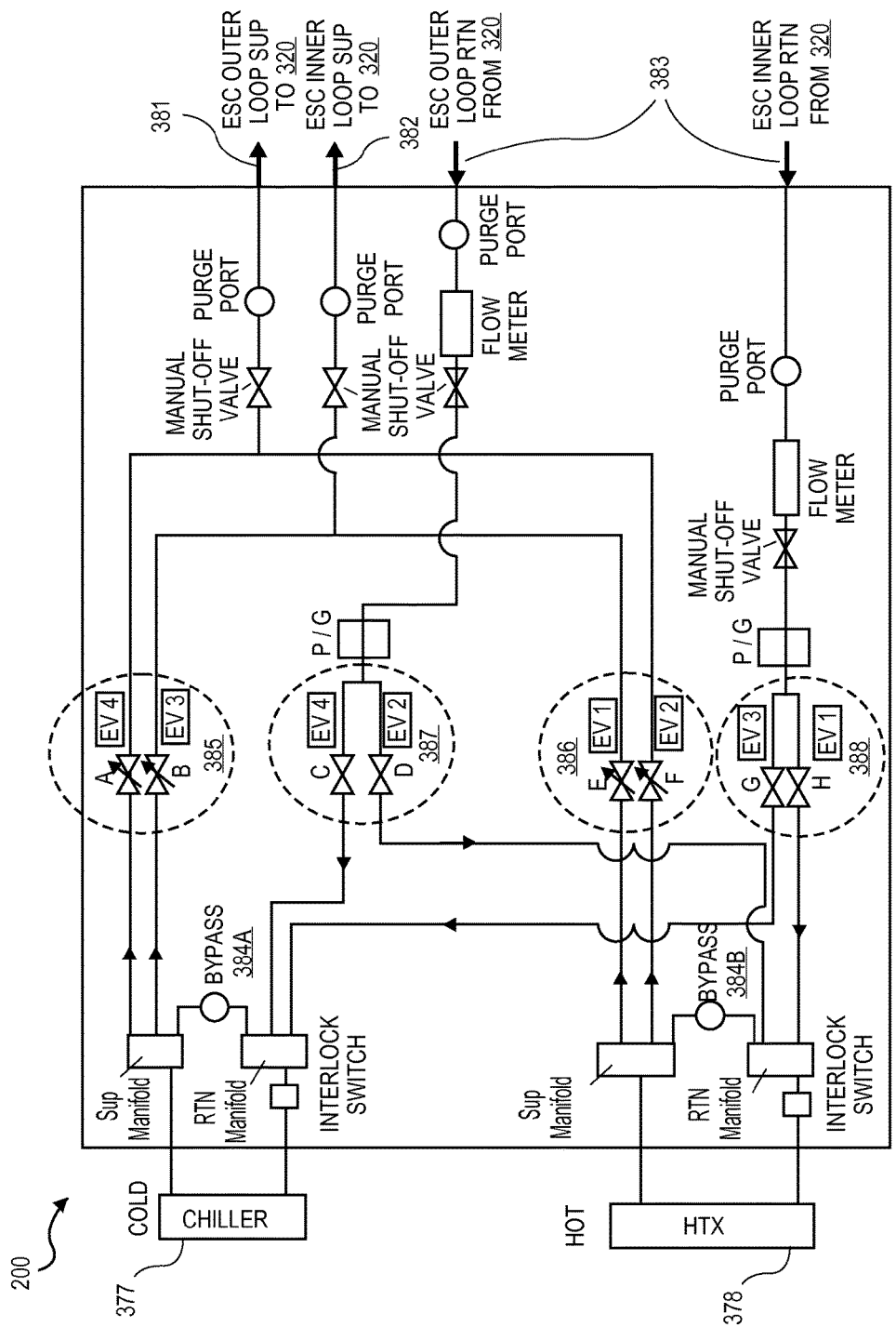
FIG. 2 illustrates a valve and plumbing schematic for the heat transfer fluid-based heat source/sink employed in the plasma etch system of FIG. 1, in accordance with an embodiment of the present invention.

In an embodiment, a temperature controlled component has a first and second temperature zone, the first temperature zone having a portion of a first heat transfer fluid loop embedded therein, and the second temperature zone having a portion of a second heat transfer fluid loop embedded therein. FIG. 2 illustrates a valve and plumbing schematic for the heat transfer fluid-based heat source/sink system 200 which may be employed in the plasma etch system 300, in accordance with an embodiment of the present invention where a chuck has a plurality of controlled temperature zones. As further depicted, a pair of heat transfer fluid supply lines 381 and 382 thermally couple the chiller 377 to a heat transfer fluid channel embedded in the chuck 320 via the supply valves 385A, 385B. In an embodiment, the line 381 is coupled to a heat transfer fluid channel embedded subjacent to a first, outer zone, of the chuck working surface while the line 382 is coupled to a heat transfer fluid channel embedded subjacent to a second, inner zone, of the chuck working surface to facilitate dual zone cooling. Similarly, the fluid supply lines 381 and 382 also couple the chuck 320 to the HTX 378 via the two supply valves 386E, 386F to facilitate dual zone heating. Return lines 383 complete the coupling of each of the inner and outer zone heat transfer fluid channels to the chiller 377 and HTX 378 via the return valves 387C, 387D and valves 388G, 388H, respectively. Each of the chiller 377 and the HTX 378 includes a heat transfer fluid reservoir (i.e., tank or bath) which is to operate at a setpoint temperature to sink or source thermal energy. With the supply valves 385A, B and 386E, F periodically placed in a closed state, to maintain a reasonably low pressure for the pump associated with the isolated heat source/sink, bypasses 384A, 384B are provided between the heat transfer fluid reservoirs and the valves 385, 386 through which heat transfer fluid is returned to the reservoirs when the supply valves 385, 386 are closed.

In an embodiment, a pair of valves in each of a plurality of heat transfer fluid loops are operable for analog flow control while another pair is operable for digital flow control. Here again, either supply or return branches of each heat transfer loop may be analog. In the exemplary two zone embodiment illustrated in FIG. 2, each of the four supply valves 385A, 385B, 386E and 386F has a closed state, a fully open state, and a partially open state to provide analog flow control of heat transfer fluid from either the chiller 377 or the HTX 378 to either the inner or outer zone of the chuck 320. Each of the four return valves 387C, 387D, 388G and 388H lack a partially open state.

Figure 3:
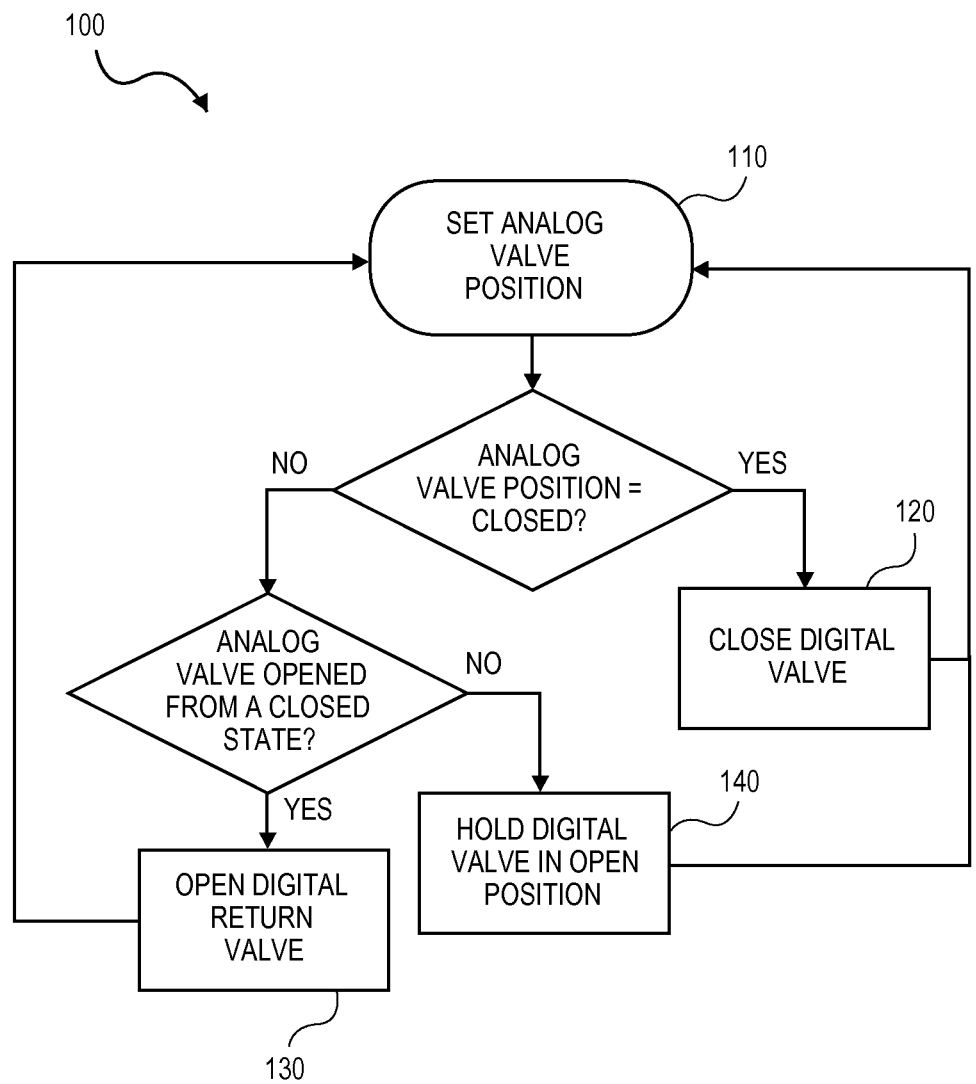
FIG. 3 illustrates a flow diagram illustrating operations in a valve control algorithm applicable to the valve and plumbing schematic for the heat transfer fluid-based heat source/sink illustrated in FIG. 1 or FIG. 2, in accordance with embodiments of the present invention.
Figure 4:
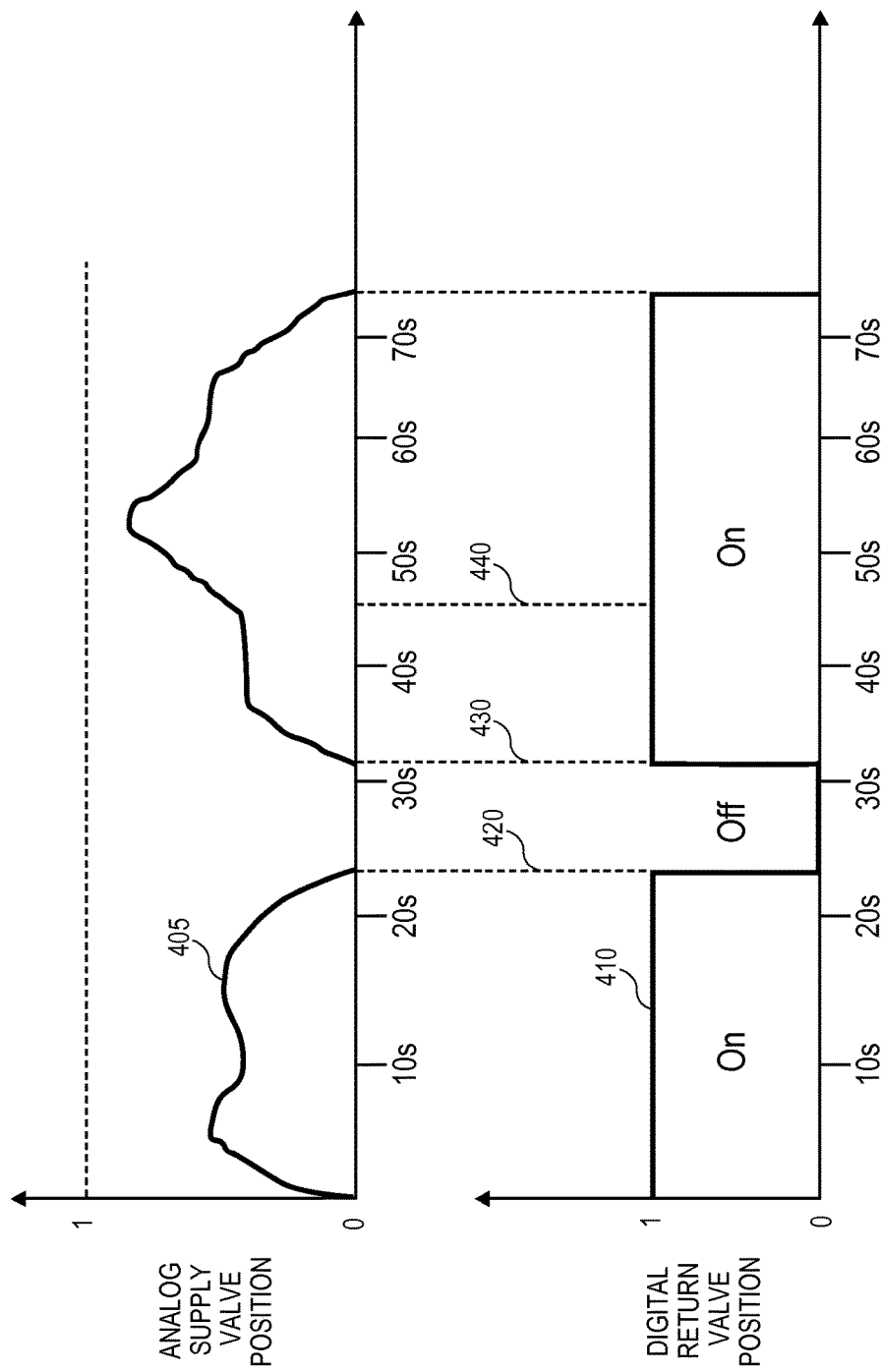
FIG. 4 illustrates positions of certain valves illustrated in FIG. 1 or FIG. 2 when controlled by the valve control algorithm illustrated in FIG. 3, in accordance with embodiments of the present invention.

FIG. 3 illustrates a flow diagram illustrating operations in a valve control method 100 applicable to the valve and plumbing schematic for the heat transfer fluid-based heat source/sink illustrated in FIG. 1 or FIG. 2, in accordance with embodiments of the present invention. FIG. 4 graphs positions of certain valves illustrated in FIG. 1 or FIG. 2 over time when controlled by the valve control method 100, in accordance with embodiments of the present invention.

Referring first to FIG. 3, at operation 110 the position of an analog valve is set based on a temperature control loop (e.g., any feedforward and/or feedback loop known in the art). In an embodiment, the temperature controller 375 is to change the state of a digital valve only if a corresponding analog valve is changed either to the closed state or from the closed state. In the example illustrated in FIG. 4, operation 110 is performed on a supply valve (e.g., supply valve 385A, 385B, 386E, or 386D) at mark 420 corresponding to approximately 23 seconds on the x-axis. Operation 110 modulates the analog supply valve position 405 from a partially open state (e.g., 1%) to a closed state. At operation 120, the digital valve position 410 is modulated from the fully open state to the closed state. In the example shown in FIG. 4, the digital return valve is modulated to the closed state at mark 420. However, particularly for embodiments where there are a plurality of heat transfer loops (e.g., for the inner and outer zones in the system 200), valve chatter (e.g., between return valves 387C, 387D, 388G, or 388H) may be mitigated by introducing a hysteresis into the digital valve modulation. For example, the digital valve state change performed at operation 120 may be triggered at some threshold proportion of the analog valve slightly above 0% (e.g., 1% to 5%)

Referring back to FIG. 3, the valve control method 100 returns to operation 110 where the analog valve position is set again based on the temperature control loop. In the example illustrated in FIG. 4, operation 110 is again performed on a supply valve (e.g., supply valve 385A, 385B, 386E, or 386D), this time at mark 430 corresponding to approximately 32 seconds on the x-axis. Operation 110 modulates the analog supply valve position 405 from the closed state (e.g., 0%) to a partially open state (e.g., 2%). Because the analog valve is opened from a closed state, operation 130 is performed and the digital valve is modulated from the closed state to the fully open state, for example as shown in FIG. 4 for the digital return valve at mark 430. For operation 130 also, a hysteresis may be deliberately introduced in the digital valve state change.

Referring back to FIG. 3, the valve control method 100 returns to operation 110 where the analog valve position is set again based on the temperature control loop. In the example illustrated in FIG. 4, operation 110 is again performed on a supply valve (e.g., supply valve 385A, 385B, 386E, or 386D), this time at mark 440 corresponding to approximately 45 seconds on the x-axis. Operation 110 modulates the analog supply valve position 405 from a first partially open state (e.g., 37%) to a second partially open state (e.g., 39%). Following valve control method 100, because the analog valve position is not closed and is not opened from a closed state, operation 140 is performed and the digital valve is maintained in the fully open state, for example as shown in FIG. 4 for the digital return valve at mark 440. For operation 140 also, a hysteresis may be deliberately introduced.

Applying the valve control method 100, the analog valve is modulated to various states a first number of times over a given time interval while the digital valve modulates from the closed state to the fully open state a second number of times over the time interval. Generally, the number of times the digital valve undergoes a state change for the purpose of redirecting the heat transfer fluid will therefore be far smaller than the number of times the analog valve is modulated for the purpose of controlling heat transfer flow rate. As such, the lifetime of the digital valves is extended relative to implementations where heat transfer fluid flow rate is digitally modulated via PWM. Furthermore, as shown in FIG. 4, the digital valve operates only when the heat transfer fluid flow rate is close to zero. As such, "fluid hammer" is significantly reduced relative to where heat transfer fluid flow rate is digitally modulated via PWM. Response time of the heat transfer fluid flow to temperature deviations is also enhanced relative to implementations where heat transfer fluid flow rate is digitally modulated via PWM because there is no PWM period which must expire before changing the position of the flow rate control valve.

Figure 5:
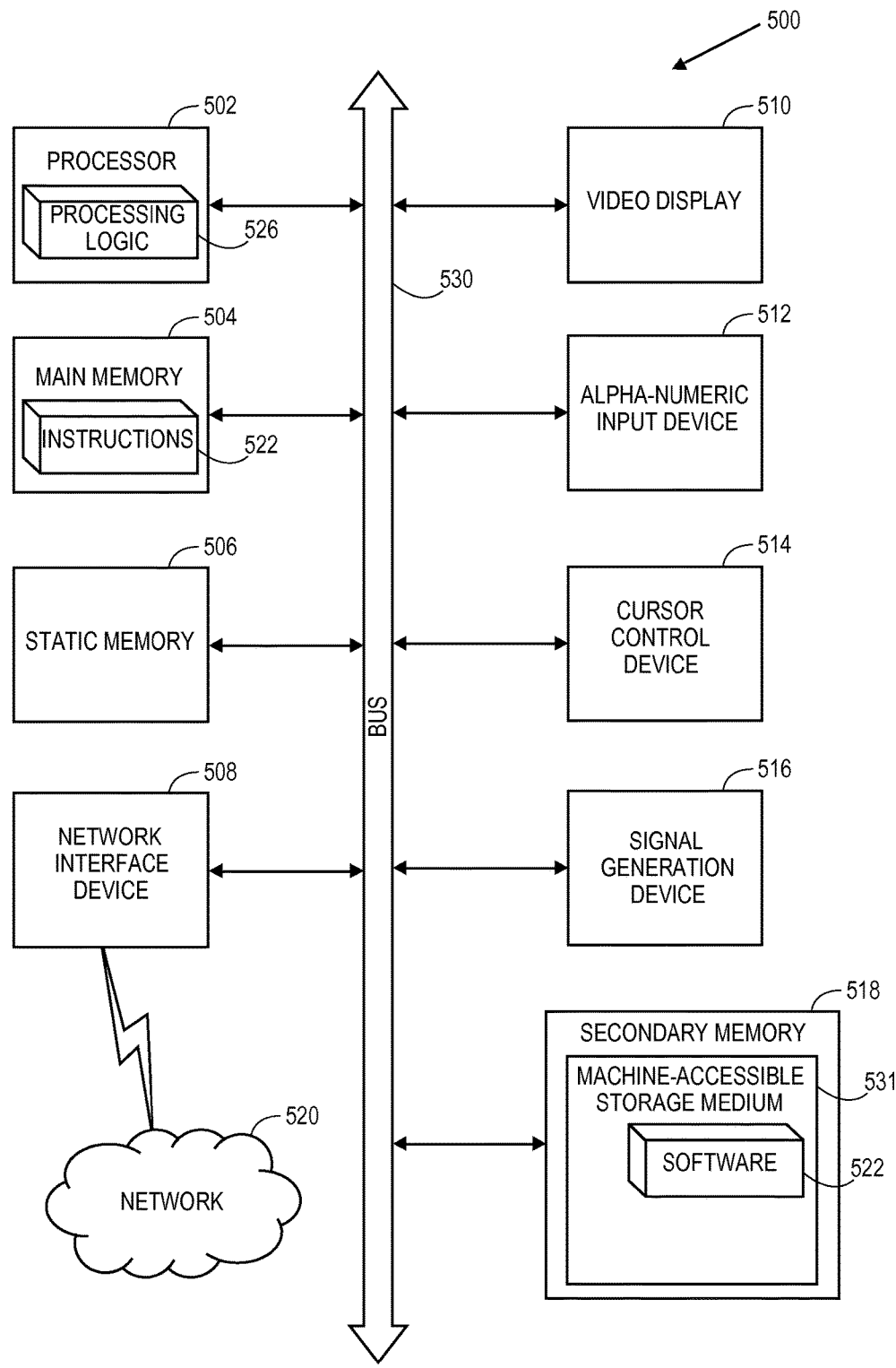
FIG. 5 illustrates a block diagram of an exemplary computer system incorporated into the plasma etch system depicted in FIG. 1 which is configured to automatically execute the valve control algorithm illustrated in FIG. 3, in accordance with one embodiment of the present invention.

FIG. 5 illustrates a diagrammatic representation of a machine in the exemplary form of a computer system 500 which may be utilized to perform the valve control operations described herein (e.g., to execute the method 100). In one embodiment, the computer system 500 is provisioned as the controller 370 in the plasma etch system 300. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 500 includes a processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

The processor 502 represents one or more general-purpose processing devices such as a microprocessor, central processing unit, or the like. The processor 502 may also be one or more special-purpose processing devices such as an application specific integrated circuit (ASIC), a field programmable gate array (FPGA), a digital signal processor (DSP), network processor, or the like. The processor 502 is configured to execute the processing logic 526 for performing the valve control operations discussed elsewhere herein.

The computer system 500 may further include a network interface device 508. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium (or more specifically a computer-readable storage medium) 531 on which is stored one or more sets of instructions (e.g., software 522) embodying any one or more of the valve control algorithms described herein (e.g., method 100). The software 522 may also reside, completely or at least partially, within the main memory 504 and/or within the processor 502 during execution thereof by the computer system 500, the main memory 504 and the processor 502 also constituting machine-readable storage media. The software 522 may further be transmitted or received over a network 520 via the network interface device 508.

The machine-accessible storage medium 531 may further be used to store a set of instructions for execution by a processing system and that cause the system to perform any one or more of the valve control algorithms described herein (e.g., method 100). Embodiments of the present invention may further be provided as a computer program product, or software, that may include a machine-readable medium having stored thereon instructions, which may be used to program a computer system (or other electronic devices) to control a plasma processing chamber temperature according to the present invention as described elsewhere herein. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, and other such non-transitory storage media.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A plasma processing apparatus, comprising:
a process chamber including a temperature controlled component;
a first heat transfer fluid reservoir at a first temperature;
a first heat transfer fluid loop comprising a first supply line and a first return line coupling the first heat transfer fluid reservoir to the temperature controlled component;
a first electronic supply valve in the first supply line and a first electronic return valve in the first return line to control conduction of a first heat transfer fluid between the first heat transfer fluid reservoir and the temperature controlled component, wherein one of the first electronic supply valve and first electronic return valve has a closed state, a fully open state, and a partially open state, and wherein the other of the first electronic supply valve and the first electronic return valve has only a closed and fully open state, wherein the first electronic supply valve is a pulsed valve;
a second heat transfer fluid reservoir at a second temperature;
a second supply line and a second return line coupling the second heat transfer fluid reservoir to the temperature controlled component; and
a second electronic supply valve in the second supply line and a second electronic return valve in the second return line to control conduction of a second heat transfer fluid between the second heat transfer fluid reservoir and the temperature controlled component, wherein one of the second electronic supply valve and second electronic return valve has a closed state, a fully open state, and a partially open state, and wherein the other of the second electronic supply valve and the second electronic return valve has only a closed and a fully open state.

2. The plasma processing apparatus of claim 1, wherein the first electronic supply valve has a closed state and a plurality of partially open states corresponding to non-zero fluid flow rates.

3. The plasma processing apparatus of claim 2, further comprising a controller to change the state of the first electronic supply valve based on a feedback or feedforward control loop coupled to the temperature controlled component.

4. The plasma processing apparatus of claim 3, wherein the controller is to change the state of the first return valve only if the first electronic supply valve is changed either to the closed state or from the closed state.

5. The plasma processing apparatus of claim 4, wherein the controller is to change the first electronic return valve from an open state to a closed state only if the first electronic supply valve is changed from an open state to the closed state, and is to change the first electronic return valve from the closed state to the open state only if the first electronic supply valve is changed from the closed state to an open state.

6. The plasma processing apparatus of claim 1, wherein the temperature controlled component comprises a first and second temperature zone, the first temperature zone having a portion of the first heat transfer fluid loop embedded therein, and the second temperature zone having a portion of a second heat transfer fluid loop embedded therein, wherein the second heat transfer loop comprises the second supply line and the second return line coupling the second heat transfer flush reservoir to the temperature controlled component.

7. The plasma processing apparatus of claim 6, wherein the second heat transfer fluid loop comprises:
a third supply line and a third return line coupling the first heat transfer fluid reservoir to the temperature controlled component;
a third electronic supply valve in the third supply line and a third electronic return valve in the third return line to control conduction of the first heat transfer fluid between the first heat transfer fluid reservoir and the temperature controlled component, wherein one of the third electronic supply valve and third electronic return valve has a closed state, a fully open state, and a partially open state, and wherein the other of the third electronic supply valve and the third electronic return valve has only a closed and a fully open state.

8. The plasma processing apparatus of claim 7, wherein the second heat transfer fluid loop further comprises:
a fourth supply line and a fourth return line coupling the second heat transfer fluid reservoir to the temperature controlled component;
a fourth electronic supply valve in the fourth supply line and a fourth electronic return valve in the fourth return line to control conduction of the second heat transfer fluid between the second heat transfer fluid reservoir and the temperature controlled component, wherein one of the fourth electronic supply valve and fourth electronic return valve has a closed state, a fully open state, and a partially open state, and wherein the other of the fourth electronic supply valve and the fourth electronic return valve has only a closed and a fully open state.

9. The plasma processing apparatus of claim 1, wherein the first temperature is above 50° C. and the second temperature is below 5° C., and wherein the temperature controlled component is at least one of: a chuck configured to support the workpiece during processing, a gas showerhead through which process gases are to be introduced to the process chamber during processing, or a wall of the process chamber.

10. A plasma etch apparatus for processing of microelectronic devices, comprising:
a process chamber including a chuck for supporting a workpiece during processing, the chuck having a first and second temperature zone;
a first heat transfer fluid reservoir at a first temperature;
a first heat transfer fluid loop comprising a first supply line and a first return line thermally coupling the first heat transfer fluid reservoir with the first temperature zone;
a first electronic supply valve in the first supply line and a first electronic return valve in the first return line to control conduction of the first heat transfer fluid between the first heat transfer fluid reservoir and the first temperature zone;
a second heat transfer fluid reservoir at a second temperature;
a second supply line and a second return line thermally coupling the second heat transfer fluid reservoir to the second temperature;
a second electronic supply valve in the second supply line and a second electronic return valve in the second return line to control conduction of the second heat transfer fluid between the second heat transfer fluid reservoir and the second temperature zone,
wherein the first and second electronic supply valves each have a closed state, a partially open state and a fully open state, and wherein the first and second electronic return valves each have only closed and fully open states, wherein the first and second electronic supply valves are pulsed valves.

11. The plasma etch apparatus of claim 10, further comprising a controller to change the state of the first electronic supply valve based on a feedback or feedforward control loop coupled to the temperature controlled component.

12. The plasma etch apparatus of claim 11, wherein the controller is to change the state of the first electronic return valve only if the first supply valve is changed either to the closed state or from the closed state.

13. The plasma etch apparatus of claim 12, wherein the controller is to change the first electronic return valve from the fully open state to the closed state only if the first electronic supply valve is changed from an open state to the closed state, and is to change the first electronic return valve from the closed state to the fully open state only if the first electronic supply valve is changed from the closed state to an open state.

* * * * *